United States Patent [19]
Maser

[11] Patent Number: 4,857,683
[45] Date of Patent: Aug. 15, 1989

[54] MEMBRANE SWITCHCORES WITH KEY CELL CONTACT ELEMENTS CONNECTED TOGETHER FOR CONTINUOUS PATH TESTING

[75] Inventor: Thomas L. Maser, Mequon, Wis.

[73] Assignee: W. H. Brady Co., Milwaukee, Wis.

[21] Appl. No.: 290,784

[22] Filed: Dec. 28, 1988

[51] Int. Cl.[4] ........................ H01H 13/70; H05K 1/00

[52] U.S. Cl. .................................... 200/5 A; 174/68.5; 200/512; 200/292; 361/398

[58] Field of Search .................... 200/5 R, 5 A, 86 R, 200/512-517, 292; 361/398; 174/68.5

[56] References Cited

U.S. PATENT DOCUMENTS

| | | | |
|---|---|---|---|
| Re. 29,440 | 10/1977 | Durkee et al. | 200/513 X |
| 3,699,294 | 10/1972 | Sudduth | 200/292 X |
| 3,860,771 | 1/1975 | Lynn et al. | 200/513 X |
| 3,987,259 | 10/1976 | Larson | 200/5 A |
| 4,127,740 | 11/1978 | La Marche | 200/5 A X |
| 4,451,714 | 5/1984 | Eventoff | 200/512 X |
| 4,488,016 | 12/1984 | Fukukura | 200/5 A |
| 4,493,952 | 1/1985 | Kaleida | 200/512 X |
| 4,562,315 | 12/1985 | Aufderheide | 200/5 A |
| 4,647,729 | 3/1987 | Collar et al. | 200/292 X |
| 4,795,861 | 1/1989 | O'Rourke | 361/398 X |

*Primary Examiner*—J. R. Scott
*Attorney, Agent, or Firm*—Quarles & Brady

[57] ABSTRACT

Flexible membrane switchcores (**100, 100*a*, 100*b*) including a conductive first circuit (180) having first traces (171-178;194;196) and a conductive second circuit (185) having second traces (186-192;195;197), first contact elements (107*a*-162*a*) formed as nonbranched integral sections of the first traces (171-178;194;196), and second contact elements (107*b*-172*b*) formed as nonbranched integral sections of the second traces (186-192;195;197**).

5 Claims, 5 Drawing Sheets

MEMBRANE SWITCHCORES WITH KEY CELL CONTACT ELEMENTS CONNECTED TOGETHER FOR CONTINUOUS PATH TESTING

TECHNICAL FIELD

This invention relates to membrane switchcores comprising one or more plastic film membranes on which are formed conductive circuits including contact elements that define a plurality of key cells.

BACKGROUND

An electronic keyboard is an essential user interface device required for the input of information for many types of data processing systems. The principal elements of a full-travel keyboard comprise keys or keypads supported for actuation by an operator, a switchcore defining an array of switches to develop electrical signals in response to actuation of the keys, and electronic circuitry associated with the switch array for detecting actuation of a key. The associated electronic circuitry includes drive means for scanning the switch array at a high rate and sense means for detecting the change in an electrical signal upon closure of a specific switch by manual actuation of a key. The switchcore is the device that generates the electrical signals ultimately decoded as commands transmitted to other elements of the system to have the product perform the functions the user intends. Thus, the switchcore is the internal communication link between the user and the microprocessor, memory and other electronic components of data processing systems such as a word processor, typewriter, computer terminal and the like.

The switch array for a state-of-the-art keyboard is now generally a membrane switchcore comprising one or more thin flexible plastic films carrying conductive circuitry applied thereto by printing or vacuum deposition techniques. Flexible plastic film membranes of this type have to a large extent replaced circuit boards of hard rigid plastic, such as phenolic or glass-epoxy compositions, on which the circuits are formed by metal plating and etching methods which had been in common use prior to the development of flexible membrane elements. The switchcore may be either of the contact type or of the capacitance type and defines an array of crosspoints between circuits of the switchcore, there being one crosspoint for each key cell.

My present invention relates to the type of membrane switchcore which includes a pair of coplanar contact elements defining a switch at each key cell or crosspoint of a matrix of key cells. The switchcore can be a contact type of switchcore in which there are two contact elements at each key cell of the matrix or a capacitance switchcore of the type in which there are two contact elements that form a contact in series with a fixed capacitor at each key cell of the matrix. In a contact membrane switchcore of the type under consideration, wherein each key cell includes a pair of contact elements, one such contact element is connected to a conductive trace that is connected to external circuitry and the other contact element at a key cell is connected to a different conductive trace that also is connected to external circuitry. There can be as many as from 36 to 122 or more key cells in a switchcore that is to be combined with a keyboard such as used with a typewriter or computer terminal. The circuits on the membrane switchcore will thus include a plurality of conductive traces, and there will be a plurality of contact elements connected to each conductive trace.

More specifically, this invention relates to membrane switchcores having a plurality of key cells in which each cell includes two coplanar fixed contact elements adjacent to but physically separated from one another and wherein each contact element has one or more fingers interdigitated with fingers of the other contact element at a key cell. A movable contact, which is normally spaced vertically from the coplanar contact elements, and can be carried by an element separate from the switchcore, is adapted to be manually pushed so as to bridge the coplanar contact elements to allow current to flow across the contact elements when a key cell is actuated. The movable contacts can be on the inboard end of the reciprocable keys of a keyboard combined with the switchcore, carried by an elastomeric element actuated by the keys of a keyboard, or they can be located on a second plastic film joined to and spaced from the plastic film carrying the contact elements.

In the typical prior art membrane switchcores of the foregoing type, each conductive trace has a plurality of contact elements connected to it in branched fashion, and each contact element has one or more fingers extending from a portion thereof. A contact membrane switchcore of this prior art design has a serious disadvantage in that it is not practically possible to conduct a complete continuity test of the conductive circuits as part of the manufacturing process. As will be explained in greater detail below, the number of test points that would be required to perform a complete continuity test of a prior art contact switchcore of this type is so high that it is not feasible for any manufacturer of membrane switchcores to conduct. This necessitates a compromise wherein a quality manufacturer will conduct testing at fewer than the total required test points in order to enhance the reliability of its products. A membrane switchcore having circuits including contacts that enabled full continuity testing would be highly advantageous to both the manufacturer and end user of switchcores.

Accordingly, the principal object of my present invention was to develop new circuitry configurations for membrane switchcores having contacts that enable practical full continuity testing of all of the conductive elements of the circuits. A more specific object of this invention was to develop new structure for the contact elements at the key cells of a membrane switchcore that are of such form and structure as to facilitate continuous path testing. These and other features, objectives and advantages of my invention will be made apparent in the detailed description which follows that sets forth several exemplary membrane switchcores incorporating the concepts of this invention.

DISCLOSURE OF THE INVENTION

This invention provides a membrane switchcore comprising a flexible plastic film substrate, a first circuit including a plurality of conductive first traces and a plurality of first contact elements, a second circuit including a plurality of conductive second traces and a plurality of second contact elements, wherein the first contact elements consist of integral sections of the first traces and each first trace and its respective first contact elements define a continuous conductive path, and wherein the second contact elements consist of integral sections of the second trace and each second trace and its respective second contact elements define a continuous conductive path. A membrane switchcore of the invention can be of the "open" type in which the contact elements at a key cell are exposed to the environment or of the "closed" type in which a second flexible plastic film extends over and covers the contact elements. It will be shown in the detailed description that a membrane switchcore of the invention can undergo full continuity testing in a manner that is not practical with prior art switchcores incorporating contact elements that branch off from conductive traces.

DESCRIPTION OF THE DRAWINGS

The invention is fully described below by reference to the accompanying drawings, in which.

Figure 1:
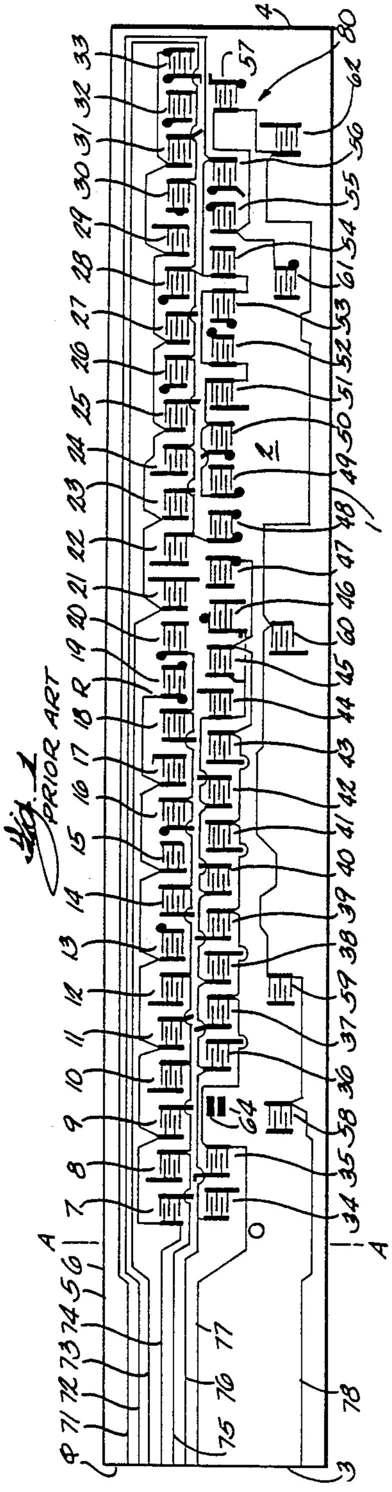
Fig. 1 PRIOR ART
FIG. 1 is a plan view of one circuit of a typical prior art contact membrane switchcore.

DESCRIPTION OF PREFERRED EMBODIMENTS (a) Prior Art Switchcore

FIGS. 1-6 present several views of a typical prior art contact membrane switchcore which includes a flexible plastic film substrate 1 on which the various components of the switchcore are supported. Substrate 1 is rectangular in shape in this example, and has an upper surface 2 on which various circuit elements will be printed in conductive ink as described below, first end 3 and second end 4. The section of substrate 1 from first end 3 to the position indicated by line A—A forms a tail panel 5 and electronic drive and sense circuitry to be connected to the switchcore will be connected along end 3 to conductive traces extending across the tail panel 5. The remainder of the substrate comprising the section thereof from line A—A to second end 4 forms a circuit panel 6 on which the key cell contacts and associated circuitry will be defined as explained below.

Figure 2:
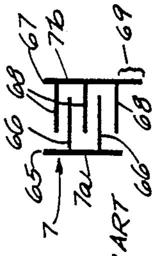
Fig. 2 PRIOR ART
FIG. 2 is an enlarged plan view of a typical contact of the circuit illustrated in FIG. 1.

Turning now to FIG. 1, a plurality of conductive contacts 7-62 are formed on contact panel 6 of the substrate, there being one such contact for each key cell of the matrix defined by the switchcore. FIG. 2 illustrates the structure of contact 7 on an enlarged scale for clarity of description, the structure of which is typical of most of the contacts illustrated in FIG. 1. Contact 7 consists of first contact element *7a* and second contact element *7b* that are physically and electrically separated from each other. First contact element *7a* includes a vertical bar 65 and two horizontal fingers 66 extending from bar 65. Second contact element *7b* includes a vertical bar 67 and three horizontal fingers 68 extending from bar 67. The fingers 66 of first contact element *7a* are interdigitated with fingers 68 of second contact element *7b*. Bar 67 of the second contact element is longer than bar 65 of the first contact element and includes an end portion 69 that extends beyond the opposite end of bar 65, which end portion 69 is on a second layer of the switchcore as described below in connection with FIGS. 3-6. Most contacts 7-62 includes an end portion 69, some of which are in the nature of a flag portion, see e.g. element *57b* of contact 57, on a second layer of the switchcore for the purpose described later. Thus, the first contact element *7a-62a* of each contact is entirely located on surface 2 of the substrate and the fingers and most of the bar 67 of the second contact element *7b-62b* of each contact are on surface 2 but the end portion 69 thereof is on a second surface of the switchcore. (Conductive pads 64 shown in FIG. 1 are for connection of a LED to the switchcore but are not part of the present invention.)

Returning now to FIG. 1, eight conductive first traces 71-78 extend from first end 3 of substrate 1 across tail panel 5 and onto circuit panel 6 along surface 2 of the substrate. The first contact element *7a-62a* of each contact 7-62 is connected to a selected first trace, there being seven first contact elements connected to each first trace. The following Table 1 lists the first contact elements *7a-62a* connected to each first trace 71-78.

TABLE 1

| First Trace | First Contact Elements | | | | | |
|---|---|---|---|---|---|---|
| 71 | 56a, | 54a, | 53a, | 52a, | 51a, | 50a and 49a |
| 72 | 32a, | 30a, | 28a, | 26a, | 24a, | 22a and 48a |
| 73 | 21a, | 23a, | 25a, | 27a, | 29a, | 31a and 33a |
| 74 | 7a, | 9a, | 11a, | 13a, | 15a, | 17a and 19a |
| 75 | 8a, | 10a, | 12a, | 14a, | 16a, | 18a and 20a |
| 76 | 34a, | 36a, | 38a, | 40a, | 42a, | 44a and 46a |
| 77 | 35a, | 37a, | 39a, | 41a, | 43a, | 45a and 47a |
| 78 | 58a, | 59a, | 60a, | 62a, | 57a, | 55a and 61a |

Conductive first traces 71-78 and first contact elements *7a-62a* thus define a first conductive circuit, identified by general reference numeral 80 in FIG. 1, on surface 2 the substrate.

Figure 3:
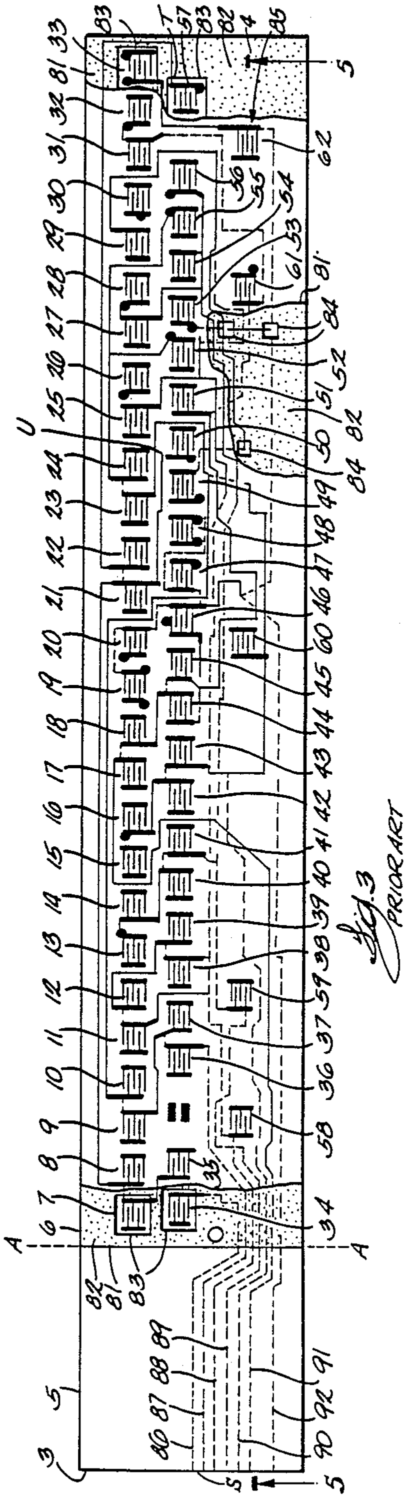
Fig. 3 PRIOR ART
FIG. 3 is a plan view of the second circuit of the prior art contact membrane switchcore.

Turning to FIG. 3, an insulating layer 81 covers circuit panel 6 of the substrate 1 and has an upper surface 82 that is spaced from surface 2 of substrate. Layer 81 is a coating of insulating material in this exemplary switchcore. The two end portions of insulating layer 81 and an intermediate portion are illustrated in FIG. 3, which are stippled to emphasize this layer in the drawing, it being understood layer 81 extends between the two end portions shown in the drawing. Layer 81 is formed in a pattern that defines an opening 83 (i.e. uncoated area) surrounding each contact 7–62 and to define other openings 84 which are described in detail below. The end portion 69 of a second contact element *7b–62b* extends on top of upper surface 82 of the insulating layer and the remaining portions of both contact elements of each contact 7–62 are along surface 2 of the substrate, see contact 62 which typifies this arrangement. Some first traces extend along surface 2 of substrate 1 under an end portion 69 of several contacts, see e.g. first trace 75 where it passes under end portion 69 of second contact elements *7b, 9b, 11b*, etc. and first trace 76 where it passes under end portion 69 of second contact elements *35b, 37b, 39b*, etc.

Conductive second circuit 85 is illustrated in FIG. 3 and includes seven conductive second traces 86–92 that extend from first end 3 of the substrate and across tail panel 5 and onto circuit panel 6 thereof. Each second trace has one or more lower sections on surface 2 of the substrate and one or more upper sections on surface 82 of the insulating layer 81. The lower sections of a second trace on surface 2 are shown in dashed line in FIG. 3 and the upper sections of each second trace on surface 82 are shown in full line. This bi-level arrangement of traces is employed to prevent shorting between traces at positions where a trace would contact another trace, which can sometimes be necessary when space limitations restrict the routing of the traces. The lower and upper sections of a second trace are connected together at an opening 84 defined by insulating layer 81 as illustrated in connection with second traces 86, 90 and 92 in FIG. 3. (A small section of first trace 76 between contacts 44 and 46 also is located on surface 82 and is shown in dashed line in FIG. 1 and the portion thereof on surface 2 is shown in dashed line in FIG. 3.)

A plurality of second contact elements *7b–62b* are connected to each second trace, with each such second contact element being connected to only one second trace. Eight second contact elements are connected to each second trace. Table 2 lists the second contact elements *7b–62b* connected to each second trace 86–92.

TABLE 2

| Second Trace | Second Contact Elements | | | | | | |
|---|---|---|---|---|---|---|---|
| 86 | 34b, | 35b, | 7b, | 8b, | 21b, | 50b, | 22b and 57b |
| 87 | 36b, | 37b, | 9b, | 10b, | 23b, | 24b, | 52b and 55b |
| 88 | 58b, | 11b, | 12b, | 39b, | 38b, | 25b, | 26b and 54b |
| 89 | 59b, | 41b, | 40b, | 14b, | 13b, | 27b, | 28b and 56b |
| 90 | 43b, | 42b, | 16b, | 15b, | 60b, | 49b, | 29b and 30b |
| 91 | 17b, | 18b, | 44b, | 45b, | 51b, | 61b, | 31b and 32b |
| 92 | 46b, | 20b, | 19b, | 47b, | 48b, | 53b, | 62b and 33b |

The connection of a second contact element *7b–62b* to a second trace 86–92 is made along end portion 69 of the vertical bar 67 of a second contact element, end portion 69 being located along surface 82 of insulating layer 81.

Figure 4:
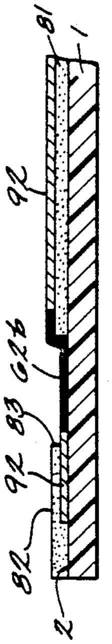
FIG. 4 PRIOR ART
FIG. 4 is a partial vertical sectional view along the plane of line 4—4 of FIG. 3.
Figure 5:
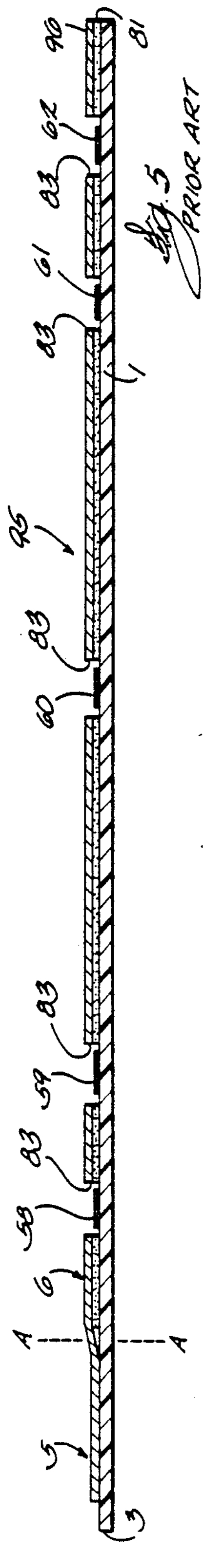
FIG. 5 PRIOR ART
FIG. 5 is a longitudinal sectional view along the plane of 5—5 of FIG. 3.

FIG. 4 is a partial vertical sectional view of a contact membrane switchcore 95 consisting of substrate 1 and the first and second circuits of FIGS. 1 and 3 on a greatly enlarged scale to show the relationship between its various components. Second contact element *62b* of contact 62 is shown in FIG. 4 with its connection to second trace 92 along surface 2 of the substrate 1 within an opening 83 in insulating layer 81 and its connection to second trace 92 along upper surface 82 of insulating layer 81 being clearly depicted in the drawing.

Switchcore 95 can be manufactured as follows. First traces 71–78 of first circuit 80 and the lower sections of second traces 86–92 of second circuit 85 are printed on surface 2 of substrate 1 using conductive ink applied by screen printing to define the requisite patterns. A coating for insulating layer 81 is then applied over circuit panel 6 of surface 2 in a pattern defining openings 83 and 84 at the proper locations but otherwise covering circuit panel 6 including the first and second traces thereon. The upper sections of second traces 86–92 (and the upper section of first trace 76) are screen printed on surface 82 of insulating layer 81 so as to connect with the lower sections of their respective second traces within the openings 84. Next, contacts 7–62 are screen printed in the appropriate pattern such that the major portion of each contact including the fingers and vertical bars are applied to surface 2 of the substrate within an opening 83 but an end portion 69 of the bar of a second contact element is located along surface 82 of insulating layer 81 so as to connect with the upper section of the appropriate second trace. As the last step in the manufacturing process, a top passivating coating is applied over circuit panel 6 and tail panel 5 of the substrate, except for a portion of the tail panel about ½ inch wide along first end 3 and except for the openings 83 so as to protect the conductive circuit elements from oxidation and/or migration. The completed switchcore 95 is shown in longitudinal section in FIG. 5, in which the top passivation coating is identified by reference numeral 96.

Figure 6:
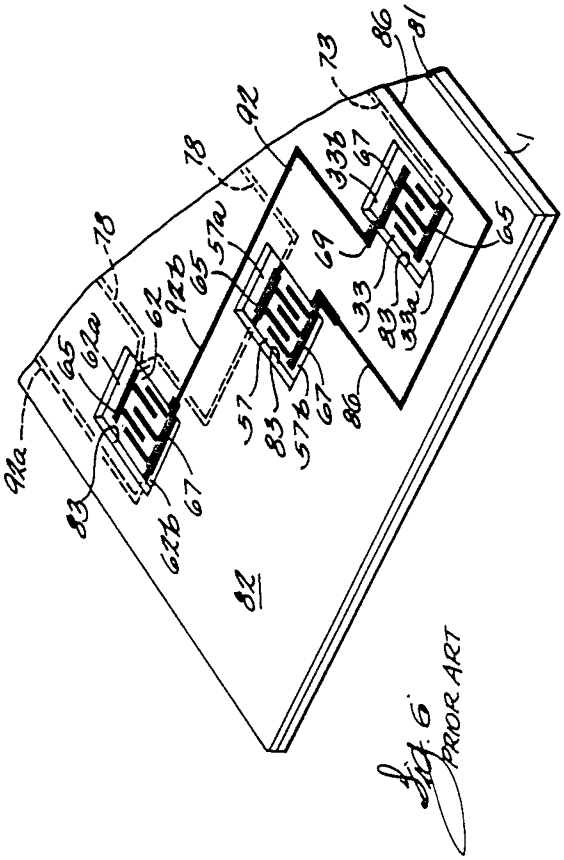
FIG. 6 PRIOR ART
FIG. 6 is a perspective view of a portion of the prior art switchcore of FIGS. 1-5.

FIG. 6 is partial perspective view illustrating a portion of switchcore 95 including contacts 33, 57 and 62 to better illustrate the bi-level arrangement of second traces 86 and 92, which are typical of the other second traces of the second circuit. The openings 83 defined in insulating layer 81 are shown as surrounding each of the contacts. First traces 73 and 78 are shown in the drawing, and are formed along upper surface 2 of substrate as previously described. First trace 73 is connected to bar 65 of first contact element *33a* of contact 33, which is at the end of trace 73. First trace 78 is connected to bar 65 of first contact element *57a* of contact 57 and then connected to bar 65 of first contact element *62a* of contact 62 from which it leads to other first contact elements. First traces 73 and 78 are shown in dashed lines in FIG. 6 to indicate that they are formed along surface 2 of the substrate. Second trace 86 is illustrated in solid line in FIG. 6 to indicate that it is formed along top surface 82 of layer 81. Trace 86 is connected to bar 67 of second contact element *52a* of contact 57, the connection between the trace and bar being along end portion 69 of the second contact element *57b* which is in the form of a flag and also is along top surface 82 of layer 81; second trace 86 terminates at this connection. Second trace 92 has a lower section *92a* on surface 2 of the substrate 1, which section is illustrated in dashed line in FIG. 6, that connects to one end of bar 67 of second contact element *62b* of contact 62. Second trace 92 has an upper section *92b* that is connected to end portion 69 of bar 67 of second contact element *62b*. End portion 69 of second contact element *62b* is located along upper surface 82 of layer 81, and upper section *92b* of second trace 92 extends along surface 82 for connection to end portion 69 of bar 67 of second contact element *33b* of contact 33, which is the last contact element connected to second trace 92, i.e. the contact element most remote from panel 5 of the switchcore. The foregoing connection of conductive traces, such as the second traces of switchcore 95, to contact elements within an opening such as openings 83, formed in an insulating coating is described and claimed in commonly-assigned U.S. Pat. No. 4,795,861 issued on Jan. 3, 1989, entitled Membrane Switch Element With Coated Spacer Layer, incorporated herein by reference.

The prior art switchcore 95 described above has a 7×8 switch matrix consisting of 56 key cells formed by the contacts 7-62. Switchcore 95 illustrates a commercially successful membrane switchcore designed for use with the keyboard of an electronic typewriter. One of the problems associated with switchcore 95, however, is that of conducting a full electrical continuity test of the complete first and second circuits after these circuits have been formed on the respective surfaces of the switchcore. Obviously, a break or discontinuity in any of the first or second traces or vertical bars of a contact would result in one or more defective key cells of the switchcore, and a break in one or more fingers of a contact also can result in a defective key cell. Each first and second trace can be tested for continuity from its end located at first end 3 of the switchcore to its terminal points along circuit panel 6. It will be noted from FIGS. 1 and 3 that each first trace 71–78 has a termination point at a single first contact element; however, second traces 86–90 are branched and have termination points at two second contact elements, trace 91 has a termination point at a single second contact element and trace 92 is branched and has termination points at four second contact elements. The various termination points for first traces 71–78 are at the first contact elements underlined in Table 1, and the termination points for second traces 86–92 are at the second contact elements underlined in Table 2. The continuity of the first traces and second traces can be tested by conducting tests between 15 test points at first end 3 and 23 test points within circuit panel 6. In switchcore 95, the 23 test points along circuit panel 6 used for continuity testing of the traces in this fashion are made at the circular pad at the contact elements underlined in Tables 1 and 2. The problem, however, lies with conducting full continuity testing of each of the contacts. It will be noted from FIGS. 1 and 3 in particular that first contact elements are branched off of a first trace and second contact elements are branched off from a second trace. Therefore, for example, testing first trace 74 from its beginning at end 3, identified by reference letter Q, to its termination point at first contact element 19*a*, identified by reference letter R, will not establish whether there are any breaks in the fingers or bars of the first contact elements connected to trace 74. Similarly, testing second trace 86 from its beginning S (FIG. 3) at end 3 to its termination point T at second contact element 57*b* and its termination point U at second contact element 50*b* will not establish whether there are any breaks in the fingers or bars of second contact elements connected to trace 86. Each first contact element includes two or three fingers and a bar, and each second contact element includes two or three fingers and a bar. In order to insure there are no breaks or discontinuities in each of the contacts, including the fingers and bars, it would be necessary to test for continuity from the end of each finger of each contact element to the end of its respective first or second trace at first end 3 of the switchcore. Testing the contact elements in this fashion would require an additional 280 test points within circuit panel 6. Therefore, to conduct a full electrical continuity test of switchcore 95, including the traces and contacts, would require testing between a total of 295 test points; it is impractical for a manufacturer of switchcores to conduct this extraordinarily large number of tests in order to insure that the circuits of each switchcore form fully continuous conductive paths. Therefore, a manufacturer can conduct a continuity test only for the first and second traces at their termination points along tail panel 5 and circuit panel 6 to provide some assurance that the circuits are functional, but not complete assurance, and assume there were no broken fingers or broken vertical bars at the contact elements. The circuits of a membrane switchcore are applied by printing with conductive inks or vacuum deposition of conductive metals or metal compounds, which methods can sometimes result in a break or discontinuity in the conductive material of a trace or contact element; however, the prior art has not yet developed circuit configurations that enable practical detection of breaks in circuits formed on membrane switchcores by these techniques. The present invention, as more fully explained below, was developed in order to resolve this problem.

(b) Switchcores of the Invention

FIGS. 7–12 illustrate a contact membrane switchcore 100 constructed in accordance with the present invention. Reference numbers used in connection with FIGS. 1–6 are used to identify those elements of switchcore 100 that are the same as corresponding elements of switchcore 95 of FIGS. 1–6; elements of switchcore 100 similar in function but different in structure to elements of switchcore 95 are identified by the reference numeral used for the corresponding element of switchcore 95 preceded with a "1" as a prefix, i.e. of the form 1XX.

Figure 7:
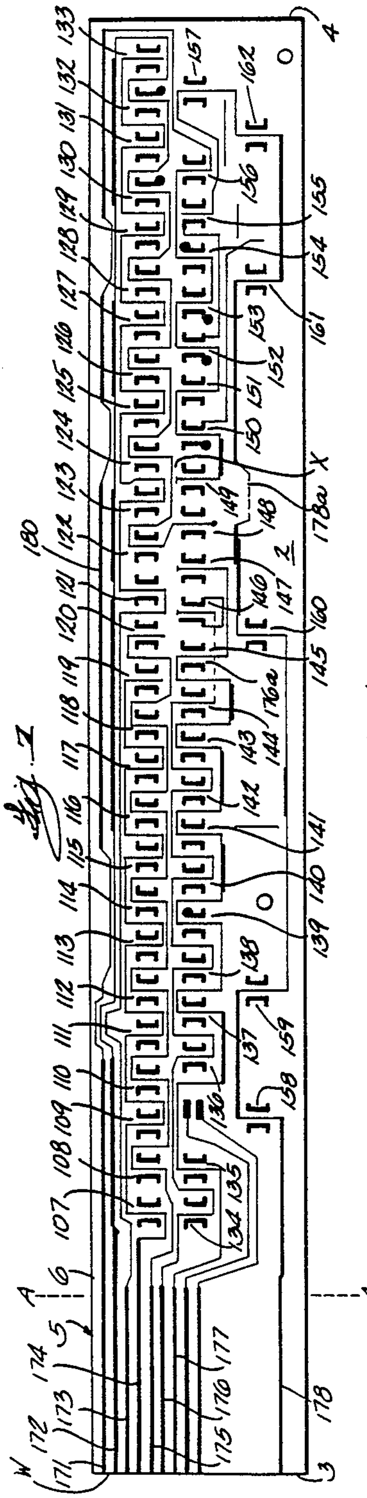
FIG. 7 is a plan view of the first circuit of a contact membrane switchcore constructed in accordance with this invention.
Figure 8:
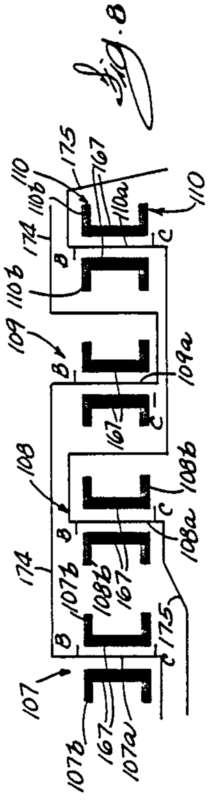
FIG. 8 is a plan view on an enlarged scale illustrating some of the contacts of the circuit illustrated in FIG. 7.

Referring first to FIG. 7, a plurality of conductive contacts 107–162 are formed on contact panel 6 of substrate 1, along surface 2 of the substrate. There is one such contact for each key cell of the matrix defined by switchcore 100. Each contact includes a pair of second contact elements 107*b*–162*b*, each comprising a generally C-shaped element, one being the mirror image of the other, that are spaced from one another along their intermediate vertical bar sections. Eight conductive first traces 171–178 extend from first end 3 of substrate 1 across tail panel 5 and onto circuit panel 6 along surface 2 of the substrate. First trace 176 has a section 176*a* between contacts 144 and 146 that is along an upper surface 82 described in detail below in connection with FIG. 9 which is shown in dashed line in FIG. 7, and first trace 178 has a short section 178*a* that also is on surface 82 and shown in dashed line in FIG. 7. It can be seen in FIG. 7 that, in accordance with this invention, each first trace 171–178 extends between the spaced second contact elements 107*b*–162*b*, each first trace passing through the second contact elements of seven contacts. Each first trace thereby has been an integral section between the spaced second contact elements 107*b*–162*b* that defines a first contact element 107*a*–162*a* for each of the contacts 107–162. FIG. 8 is a plan view of contacts 107, 108, 109 and 110 and portions of first traces 174 and 175 on an enlarged scale to more clearly illustrate this structure. The sections of first trace 174 that define first contact elements 107*a* and 109*a* and the sections of first trace 175 that define first contact elements 108*a* and 110*a* are the sections of these traces between lines B and C in FIG. 8 that lie between vertical bars 167 of second contact elements 107*b*, 108*b*, 109*b* and 110*b*. Table 3 lists the first traces 171–178 and the first contact elements 107*a*–162*a* defined by each first trace.

TABLE 3

| First Trace | First Contact Elements | | | | | |
|---|---|---|---|---|---|---|
| 171 | 156a, | 154a, | 153a, | 152a, | 151a, | 150a and 149a |
| 172 | 132a, | 130a, | 128a, | 126a, | 124a, | 122a and 148a |
| 173 | 121a, | 123a, | 125a, | 127a, | 129a, | 131a and 133a |
| 174 | 107a, | 109a, | 111a, | 113a, | 115a, | 117a and 119a |
| 175 | 108a, | 110a, | 112a, | 114a, | 116a, | 118a and 120a |
| 176 | 134a, | 136a, | 138a, | 140a, | 142a, | 144a and 146a |
| 177 | 135a, | 137a, | 139a, | 141a, | 143a, | 145a and 147a |
| 178 | 158a, | 159a, | 160a, | 161a, | 162a, | 157a and 155a |

First traces 171–178 and their respective integral first contact elements 107*a*–162*a* form first circuit 180 of the switchcore 100. Each first trace and its respective integral first contact elements define a continuous conductive path. Using an integral section of a conductive trace to define contact elements in a continuous conductive path through a plurality of contacts is the first main novel structural feature of a switchcore of this invention which leads to important advantages described later in this specification. It will be noted by comparison of FIGS. 7 and 8 to FIGS. 1 and 2 that prior art switchcore 95 does not have this type of structure.

Figure 9:
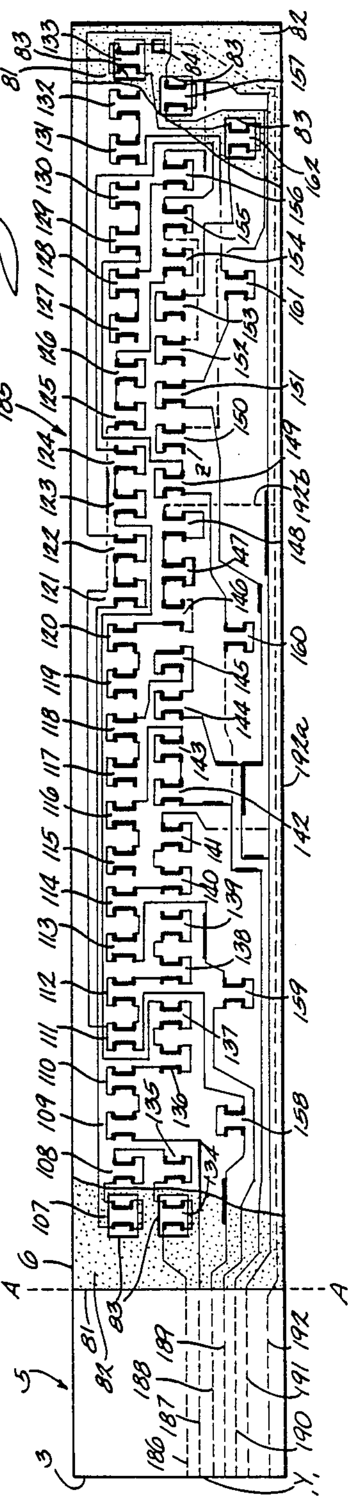
FIG. 9 is a plan view of the second circuit of a contact membrane switchcore of this invention.
Figure 12:
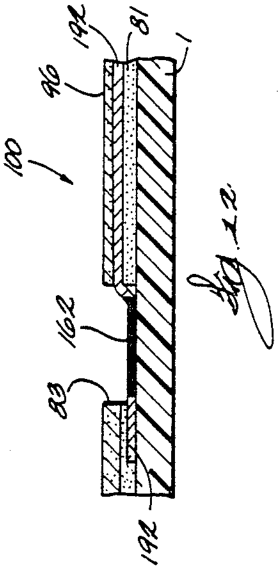
FIG. 12 is a partial vertical sectional view along the plane of line, 12—12 of FIG. 9.

Turning now to FIG. 9, insulating layer 81 covers circuit panel 6 of the substrate 1 and has an upper surface 82 spaced from surface 2 of the substrate. Only the two opposite end portions of insulating layer 81 are illustrated in FIG. 9, which are stippled for clarity of description, it being understood layer 81 extends between the two end portions shown in the drawing. Layer 81 is a patterned coating that defines an opening 83 (uncoated area) surrounding each contact 107–162 and defines other openings 84 for the purpose described below.

Conductive second circuit 185 of switchcore 100 is illustrated in FIG. 9 and includes seven conductive second traces 186–192. A lower section of each second trace 186–192 extends from first end 3 of the substrate across tail panel 5 along surface 2 of the substrate, which sections are shown in dashed line in FIG. 9. From tail panel 5, second traces 186–191 each have an upper section that extends across upper surface 82 of layer 81; the upper section of each second trace 186–191 is shown in solid line in FIG. 9. Second trace 192 has a long lower section 192*a* that extends across circuit panel 6 of the substrate along upper surface 2 thereof to near end 4 of the switchcore and a short section 192*b* on surface 2, which sections are shown in dashed line. Several other second traces have a lower section along surface 2 of the substrate within circuit panel 6, and these sections also are shown in dashed line in FIG. 9. As was the case with switchcore 95, an upper section and a lower section of a second trace connect together in an opening 84 defined by layer 81, see e.g. second trace 192 near end 4 of the substrate and FIG. 12.

Each second trace 186–192 includes integral sections that define eight pairs of second contact elements, each pair of second contact elements being part of only one second trace. The arrangement of second traces and sets of second contact elements 107*b*–162*b* is quite different than the corresponding elements of prior art switchcore 95 described above. Considering second trace 186 as shown in FIG. 9 and starting near line A—A, trace 186 has a widened section that defines left second contact element 134*b* of contact 134, extends from the lower end of said contact element across to include another widened section that defines the right second contact element 134*b*, and then extends from right second contact element 134*b* to have a widened section that forms the left second contact element 135*b* of contact 135 and another widened section that forms right second contact element 135*b*. Continuing, second trace 186 includes widened sections that define left and right second contact elements of contacts 108, 107, 121, 122, 157, and 150. Second trace 186 ends at contact 150. The other second traces 187–192 define eight pairs of second contact elements in the same manner. The structure of second trace 186 and pairs of second contact elements of contacts 134, 135, 107 and 108 is illustrated on an enlarged scale in FIG. 10 to further clarify the arrangement of second traces and second contact elements in accordance with the present invention. Table 4 lists the second traces 186–192 and the pairs of second contact elements 107*b*–162*b* defined by each second trace.

TABLE 4

| Second Trace | Second Contact Elements | | | | | | |
|---|---|---|---|---|---|---|---|
| 186 | 134b, | 135b, | 108b, | 107b, | 121b, | 122b, | 157b and 150b |
| 187 | 109b, | 110b, | 136b, | 137b, | 123b, | 124b, | 155b and 152b |
| 188 | 158b, | 111b, | 112b, | 138b, | 139b, | 125b, | 126b and 154b |
| 189 | 159b, | 113b, | 114b, | 140b, | 141b, | 156b, | 128b and 127b |
| 190 | 142b, | 143b, | 116b, | 115b, | 160b, | 149b, | 129b and 130b |
| 191 | 144b, | 145b, | 118b, | 117b, | 151b, | 161b, | 131b and 132b |
| 192 | 133b, | 162b, | 153b, | 148b, | 147b, | 146b, | 120b and 119b |

Figure 10:
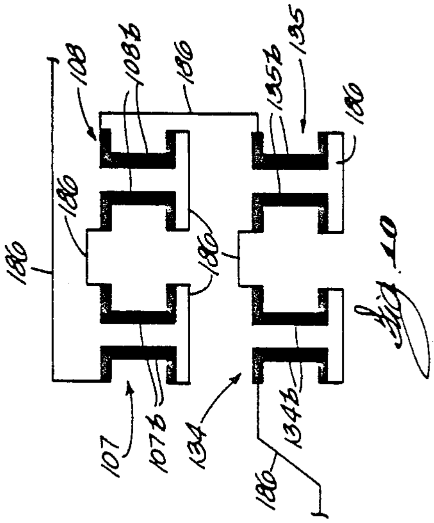
FIG. 10 is a plan view on an enlarged scale illustrating several contants of the second circuit as illustrated in FIG. 9.

It can be seen in FIGS. 9 and 10 that each second contact element is an integral section of its respective second trace so that a continuous conductive path is defined by each second trace and its respective second contact elements, in marked distinction to the branched arrangement of second contact elements and second traces in the prior art switchcore 95 described previously. The structural relationship of second traces and second contact elements of switchcore 100 is a second main novel structural feature of a switchcore of this invention and has important advantages discussed in greater detail later in this description.

Figure 11:
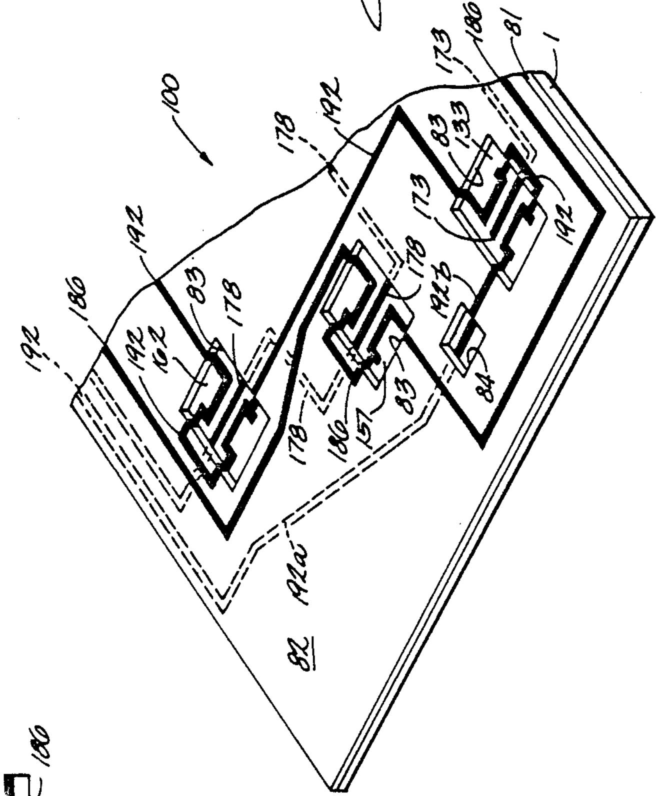
FIG. 11 is a perspective view of a portion of the switchcore of FIGS. 7-10.

FIG. 11 is a partial perspective view of a portion of switchcore 100 illustrating contacts 133, 157 and 162 and the first and second traces relating thereto to depict the arrangement of first and second traces and first and second contact elements and to further clarify the spatial relationship between first and second traces. First traces 173 and 178 are formed along upper surface 2 of substrate 1 and are shown in dashed line in FIG. 11 except for the portions thereof that define a first contact element within an opening 83 in the insulating layer. Second traces 186 and 192 are shown in solid line in FIG. 11 to indicate they are formed along top surface 82 of insulating layer 81. As shown in FIG. 11, the second traces are connected to their respective second contact elements within an opening 83 of layer 81 as described and claimed in the aforesaid U.S. Pat. No. 4,795,861. It should be noted, however, that the present invention can be practiced with constructions other than as covered by said patent; for example, insulating layer 81 can be a layer of plastic film die cut to define the required openings and adhesively laminated to the substrate 1. FIG. 11 also provides a perspective illustration of lower section 192*a* of second trace 192 connected to upper section 192*b* of the trace within an opening 84 of insulating layer 81.

A useful method for manufacturing switchcore 100 is as follows. First circuit 180, including all lower sections of first traces 171–178, second contact elements 107*b*–162*b*, and the lower sections of second traces

186–192 are printed on surface 2 of substrate 1 using conductive ink applied by screen printing to define the desired patterns. Insulating layer 81 is then applied over circuit panel 6 of surface 2 as a coating in a pattern defining openings 83 and 84 at the proper locations but otherwise covering panel 6 including the first and second traces printed thereon. Next, the upper sections of second traces 186–192 are screen printed on surface 82 of insulating layer 81 so as to connect with their respective lower sections within the openings 84 and to connect with their respective pairs of second contact elements **107*b*–162*b* within the openings 83 so that the contact elements are integral sections of their respective second traces. A top passivating coating 96 is then applied over circuit panel 6 and tail panel 5 of the substrate, except for a portion of the tail panel about ½ inch wide along first end 3 and except for the openings 83, so as to protect the conductive circuit elements from oxidation and/or migration. The completed switchcore 100 is shown in partial vertical section in FIG. 12; in longitudinal section, switchcore 100 will look similar to FIG. 5**.

As described above, the first contact elements are integral sections of their respective first traces and the second contact elements are integral sections of their respective second traces. The term "integral section" as used in this description and in the claims in reference to the relationship between a contact element and a trace is defined to mean that a break or discontinuity in the conductive material of a contact element results in a break or discontinuity in the trace of which it is an integral section. This type of break would cause a failure for the end user, but it can be reliably and readily detected by continuity testing of a switchcore of this invention as described below. Thus, the contact elements are integral nonbranched sections of their respective traces. "Nonbranched" as used herein and in the claims means that all current-carrying portions of a contact element are integral sections of its respective trace so that current passing through the contact element will also pass through the trace; conversely, a break in a current-carrying portion of a contact element that prevents flow of current through the contact element will also prevent current flow through its respective trace.

Switchcore 100 constructed in accordance with this invention also defines a 7×8 switch matrix consisting of 56 key cells formed by contacts 107–162, i.e. switchcore 100 defines the same size of switch matrix as prior art switchcore 95 described previously. The advantage of the new switchcore 100 over that of prior art switchcore 95 is the novel circuit configuration of switchcore 100 that permits complete electrical continuity testing of all of the traces and all of the contact elements of the matrix. Referring first to FIG. 7, when a first trace 171–177 is tested for electrical continuity from its end nearest end 3 of the switchcore 100 to its termination point along circuit panel 6, the test will also establish electrical continuity of the first contact elements **107*a*–162*a* since these contact elements are integral portions of the first traces. For example, referring now to FIG. 7, first trace 171 starts at end 3 of the switchcore, the starting point being indicated by the reference letter W, and extends through the second contact elements of contacts 156, 154, 153, 152, 151, 150, and 149 to define first contact elements 149*a*–154*a* and 156*a*. First trace 171 terminates at contact 149, its termination being indicated by the reference letter X in FIG. 7. Therefore, an electrical continuity test between points W and X will establish whether first trace 171 is a continuous conductive element and this test will also establish whether the first contact elements are continuous conductive elements. The termination points for each first trace 171–178 within circuit panel 6 are at the first contact element sections thereof that are underlined in Table 3, and all the first traces and their integral first contact elements can be tested for continuity as described with respect to trace 171. It can now be seen that with the switchcore of this invention, a single continuity test of a first trace will also include a test of the first contact elements for any breaks or discontinuities in the conductive material. Turning now to FIG. 9, it will be shown that a switchcore of this invention also can be tested for full electrical continuity of the second traces and second contact elements. For example, second trace 186 starts at end 3 of the switchcore, its starting point being indicated by the reference letter Y in FIG. 9, and extends across circuit panel 6 to define the second contact elements of contacts 134, 135, 108, 107, 121, 122, 157, and 150. Second trace 186 terminates at contact 150, its termination point being indicated by the reference letter Z in FIG. 9. An electrical continuity test performed between points Y and Z will, therefore, establish whether second trace 186 is a continuously conductive element and also establish whether the second contact elements are fully continuous conductive elements. The termination points within circuit panel 6 of the second traces 186–192 are at the second contact elements underlined in Table 4; it will be noted that second traces 188 and 190–192 have two branches along the circuit panel and each therefore has two termination points on panel 6. Thus, a continuity test of the second traces of a switchcore of this invention performed in this manner will demonstrate whether there are any breaks or discontinuities in the second traces and in the second contact elements associated therewith. It can be seen that testing between only 19 test points on circuit panel 6 and 15 test points at first end 3 will establish whether or not there is complete electrical continuity of the first and second traces and the first and second contact elements in switchcore 100 which is constructed in accordance with this invention; by contrast, testing between 295 test points would be required to establish the same assurance or level of confirmed continuity in prior art switchcore 95, which has the same size matrix as switchcore 100**. A switchcore according to this invention, therefore, enables the manufacturer to conduct complete electrical continuity testing of all of the traces and contact elements in the switchcore, which is a significant advantage to the manufacturer. This also is a highly important advantage for the end user of the switchcore who will have complete assurance that the switchcore is fully functional.

Figure 13:
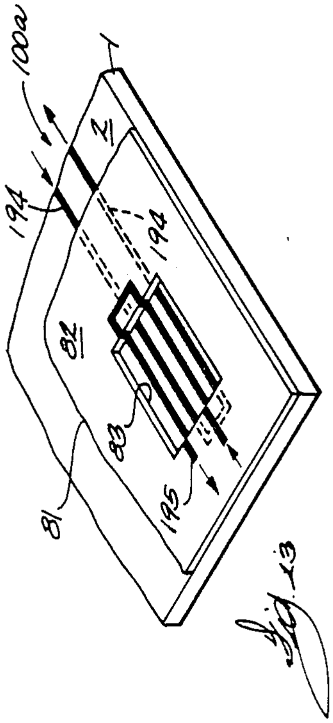
FIG. 13 is a schematic view of a second contact structure of the present invention.

FIG. 13 illustrates switchcore **100*a* with an alternate contact construction employing the concepts of the present invention. First trace 194 extends along surface 2 of substrate 1 and across opening 83 defined in coating 81 to the opposite side of the opening at which it crosses over to extend through the opening 83 again and then continue along surface 2; first trace 194 thus has two nonbranched or contiguous integral sections defining first contact elements within the opening 83. Similarly, second trace 195 which is formed along upper surface 82 of coating 81 extends through opening 83 back up to surface 82 and then crosses over to extend through opening 83** again and then exits the opening along surface 82; second trace 195 thereby includes two nonbranched or contiguous integral sections within the opening 83 that define second contact elements. The structure illustrated in FIG. 13 thus provides a contact formation in which there are four conductive trace sections, two of first trace 194 and two of second trace 195, that define a contact.

Figure 14:
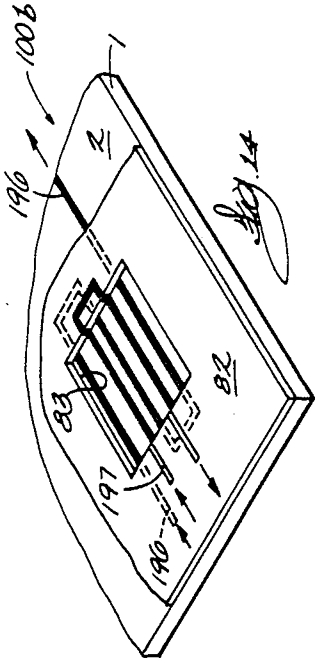
FIG. 14 is a schematic view of a third contact structure of the invention.

FIG. 14 illustrates switchcore 100*b* having another alternate construction employing the present invention. First trace 196 extends along surface 2 of substrate 1 and across opening 83 to have a first section within the opening, exits the opening and crosses over to double back upon itself to have a second section within the opening, exits the opening again at the opposite end thereof, crosses over and doubles back upon itself to have a third section within an opening 83; trace 196 then exits the opening and continues along surface 2. Second trace 197 is formed along surface 82 of coating 81 and extends across opening 83 to have a first section within the opening, exits the opening and crosses over and doubles back upon itself to have a second section within opening 83, following which trace 197 exits opening 83 and continues along surface 82. This construction thereby forms a contact having three integral nonbranched sections of the first trace that define first contact elements and two integral nonbranched sections of the second trace that define second contact elements within opening 83.

Figure 15:
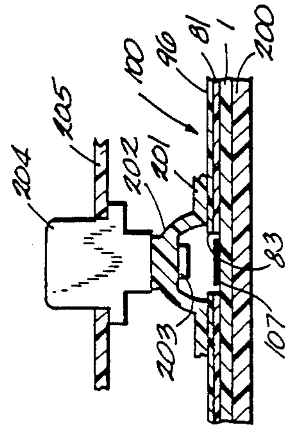
FIG. 15 is a partial sectional view illustrating a switchcore of the invention combined with a keyboard.
Figure 16:
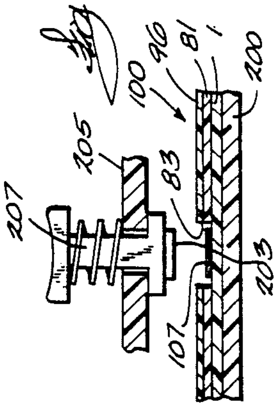
FIG. 16 is a partial sectional view illustrating another combination of a switchcore of the invention with a keyboard.

FIGS. 15 and 16 are partial sectional views illustrating the manner in which a switchcore of this invention can be combined with a keyboard. In FIG. 15, switchcore 100 rests on base panel 200 of the housing of a keyboard with a contact 107 facing upwards. An elastomeric element 201 formed to include a dome 202 for each key of the keyboard rests along the upper surface of switchcore 100. A movable contact 203 is carried along the interior of the upper section of dome 202. A key 204 is supported for manual reciprocable motion along top panel 205 of the housing of the keyboard. When resilient dome 202 is depressed or flattened by moving a key 204 downwards, contact 203 bridges first and second contact elements 107*a* and 107*b* which allows current to pass through the contact and thereby develop a electric signal detectable by sense circuitry connected to the switchcore. FIG. 16 illustrates switchcore 100 combined with a keyboard that does not include an elastomeric element. In this type of arrangement, key 207 reciprocably supported along top panel 205 of the housing of the keyboard carries movable contact 203 on its inboard end. Key 207 is biased by any suitable means, such as the spring illustrated in the drawing. Actuation of the key by an operator will cause movable contact 203 to move downward and bridge first and second contact elements 107*a* and 107*b* to generate a detectable electrical signal.

Figure 17:
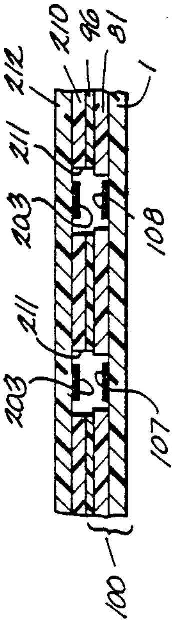
FIG. 17 is a partial sectional view illustrating a switchcore of the invention in a "closed" construction.

Switchcore 100 described above is an "open" type of switchcore wherein the contacts within openings 83 of the insulating coating are exposed to the environment. A switchcore of the invention, however, also can be made as a "closed" type of switchcore, which is represented in FIG. 17. A spacer layer 210 is joined to the upper surface of passivation coating 96 and includes an aperture 211 surrounding each contact of switchcore 100, such as shown in connection with contacts 107 and 108 in the drawing. Spacer layer 210 may comprise a thin sheet of plastic film that is die cut with apertures 211 at the appropriate locations, or it may comprise a layer of adhesive screen printed in a pattern that defines the apertures 211. A flexible plastic film top layer 212 is joined to the upper surface of spacer layer 210. The inner surface of top layer 212 carries movable contacts 203, there being one movable contact at each key cell of the switchcore. Top layer 212 is flexible so that an operator can depress it at a key cell to deflect the film sufficiently to enable movable contact 203 to bridge first and second contact elements at a key cell. The exterior surface of top layer 212 can be printed with appropriate graphics to identify individual keys; also, top layer 212 can be formed to include a dome at each key cell, with movable contacts 203 carried along the inside of the domes.

When switchcore 100 is combined with apparatus, such as a keyboard, electronic drive circuitry and sense circuitry are connected to the first and second traces of the switchcore at the end 3 of tail panel 5, using a suitable flat connector. The drive circuitry can be connected to either the first or second traces, and the sense circuitry connected to the other of the first or second traces. For example, using first traces as drive lines and second traces as sense lines, each first trace is connected to a drive amplifier associated with drive circuitry including a source of direct current at a controlled voltage and each second trace is connected to a sense amplifier which is a part of the sense circuitry. The drive amplifiers output an interrogating pulse so as to interrogate all of the key cells connected to each drive line, each drive line being interrogated sequentially with all of them scanned in a short time period of 20 milliseconds or less. When a specific key cell is actuated, an electrical signal is output to its respective second trace that is detectable by the sense amplifier and processed by decoding circuitry associated therewith. Various types of appropriate drive and sense circuitry for decoding the contact membrane switchcores are well known in the art and therefore not described in detail herein.

(c) Materials of Construction

A membrane switchcore according to the present invention can be made with the materials typically used for membrane switchcore constructions. For example, a film such as substrate 1, top film 212 or a film when used as the insulating layer 81 can be any of the nonconductive flexible plastic films suitable for flexible membrane switches. Polyester films, such as polyethylene terephthalate films, are the most commonly used materials, but polycarbonate films, polyimide films, polysulfone films, polyolefin films and unplasticized polyvinylchloride films also may be used. The films can be in the range of about 1 to 15 mils (0.025 to 0.4 mm) thick, or thicker if so desired; a film about 5 to 10 mils (0.013 to 0.26 mm) thick is apropriate for a substrate film, whereas a film used as an insulating layer will generally be thinner such as in the range of 0.1 mil to 5 mils (0.002 to 0.13 mm) thick. A structural adhesive employed to laminate two or more films together may comprise a layer of nonconductive heat activated adhesive, thermoset adhesive or pressure sensitive adhesive, of which many suitable formulations are well known in the art. A variety of compositions are suitable for insulating layer 81 when applied as a coating, including UV curable coatings, solvent coatings and epoxy coatings. Specific examples include a UV curable coating of an acrylate-epoxy resin or a UV curable coating including vinyl and acrylate esters, a solvent coating of similar polymers or copolymers, or a bisphenol A-epichlorohydrin epoxy coating. The conductive circuits can be printed with conductive inks, of which many types are well known in the art and commercially available, comprising one or more conductive metal particles such as silver, gold, carbon, copper etc., carried in a suitable binder. Also, the conductive circuits can be applied to the various layers or surfaces of the switchcore by vacuum deposition of copper or other appropriate conductive metal or metal compound onto the appropriate layer of the switchcore. Thus, another advantage of the present invention is that it can be practiced using materials currently employed in the manufacture of membrane switchcores.

There has thus been described new flexible membrane switchcores of the type having contact elements at key cells of the switchcore matrix that include conductive circuits of a novel configuration in accordance with this invention in which contact elements consist of integral nonbranched sections of conductive traces so that a trace and its associated integral contact elements define a fully continuous conductive path. This new circuit configuration facilitates full electrical continuity testing of each trace and all of the contact elements associated therewith. It is now practical for a switchcore manufacturer to conduct full continuity testing of the circuits since only a small number of test points need be used to determine that all of the contact elements and traces are fully conductive elements. The end user of a switchcore of the invention thus has 100% assurance that a switchcore of the invention, when tested in the manner described, will have contacts and traces that are fully functional in that there are no breaks or discontinuities in the conductive material defining the circuits. This is believed to be the first time that a manufacturer can conduct complete continuity testing of the contact elements and traces of a membrane switchcore and the first time that an end user has the significant benefits of complete continuity testing.

The invention has been described above by reference to certain specific embodiments, but modifications can be made to the described embodiments that will remain within the scope of the appended claims. As previously noted, for example, a coating is illustrated as the insulating layer 81 of a switchcore 100 of the invention, but a thin nonconductive plastic film can be used for the insulating layer in lieu of a coating. As another alternative, the circuits can be printed along the upper and lower surfaces of a plastic film substrate with the use of the printed through hole construction in which the substrate film has holes formed or die cut in it through which circuit elements printed on one surface are connected to circuit elements on the other surface of the substrate film; this results in a double-surface switchcore with circuit elements insulated from one another as necessary, but eliminates an insulating layer as a separate component. The switchcores of the invention described above include circuits with portions on two spaced surfaces of the switchcore, but a switchcore of the invention also can have the circuits, including traces and contacts on a single surface of a switchcore provided that the switch matrix defined by the switchcore is not larger than 2 by N key cells. These and other modifications of the described embodiments that will be obvious to one skilled in the art of the manufacture of flexible membrane switchcores from the teachings set out above are intended to be encompassed within the spirit and scope of this invention.

I claim:

1. In a membrane switchcore comprising a flexible plastic film substrate, a conductive first circuit including a plurality of conductive first traces and a plurality of conductive first contact elements connected to each first trace, and a conductive second circuit including a plurality of conductive second traces and a plurality of conductive second contact elements connected to each second trace, wherein a first contact element and a second contact element are at each key cell of the matrix and adapted to be bridged by a movable contact for actuation of a key cell, the improvement wherein:

each first contact element consists of an integral section of its respective first trace;

each second contact element consists of an integral section of its respective second trace; and each first trace and its respective first contact elements define a continuous conductive path, and each second trace and its respective second contact elements define a continuous conductive path.

2. A membrane switchcore according to claim 1 further characterized in that:

there are a plurality of first contact elements at each key cell of the matrix, and all first contact elements at a key cell consist of an integral nonbranched section of a first trace.

3. A membrane switchcore according to claim 1 further characterized in that:

there are a plurality of second contact elements at each key cell of the matrix, and all second contact elements at a key cell consist of an integral nonbranched section of a second trace.

4. A membrane switchcore according to claim 1 further characterized in that:

each first trace includes an integral nonbranched section defining one first contact element at a key cell of the matrix;

each second trace includes two integral nonbranched sections defining two spaced second contact elements in a continuous conductive path through a key cell of the matrix; and the first contact element extends between the two second contact elements at a key cell of the matrix.

5. A membrane switchcore according to any one of claims 1–4 further characterized in that:

the flexible plastic film substrate includes a surface forming a first surface of the switchcore;

an insulating layer extends over said first surface and defines a second surface of the switchcore spaced from the first surface, the insulating layer including first openings surrounding the contact elements at each key cell of the matrix;

the first traces including the first contact elements thereof are along the first surface of the switchcore;

the second traces are along the second surface of the switchcore and the second contact elements thereof are along the first surface of the switchcore; and wherein a portion of a first trace crossing a portion of another trace is along the second surface of the switchcore to prevent shorting therebetween, and a portion of a second trace crossing a portion of another trace is along the first surface of the switchcore to prevent shorting therebetween.

* * * * *